United States Patent [19]

Kennedy

[11] Patent Number: 4,600,899
[45] Date of Patent: Jul. 15, 1986

[54] DUAL MODE CRYSTAL PHASE SHIFT TRANSISTOR OSCILLATOR

[75] Inventor: Richard A. Kennedy, Russiaville, Ind.

[73] Assignee: General Motors Corporation, Detroit, Mich.

[21] Appl. No.: 700,488

[22] Filed: Feb. 11, 1985

[51] Int. Cl.$^4$ .............................................. H03B 5/36
[52] U.S. Cl. ............................ 331/116 R; 331/158; 331/177 R
[58] Field of Search ........ 331/116 R, 116 FE, 117 R, 331/117 FE, 117 D, 158, 177 R

[56] References Cited

U.S. PATENT DOCUMENTS

| | | | |
|---|---|---|---|
| 3,806,634 | 4/1974 | Abbot et al. | 178/5.4 SD |
| 4,020,500 | 4/1977 | Harwood | 331/18 X |
| 4,243,953 | 1/1981 | Balaban et al. | 331/117 R |

FOREIGN PATENT DOCUMENTS

| | | | |
|---|---|---|---|
| 3145653 | 5/1983 | Fed. Rep. of Germany | 331/116 R |
| 0014603 | 1/1983 | Japan | 331/117 R |

Primary Examiner—Eugene R. LaRoche
Assistant Examiner—D. C. Mis
Attorney, Agent, or Firm—Robert M. Sigler

[57] ABSTRACT

An oscillator comprises an amplifier with a feedback loop from the output to the input thereof, the feedback loop including a resonator such as a crystal providing oscillation of the amplifier at a predetermined frequency. A balanced modulator coupled to the amplifier generates a voltage varying at the same frequency, said voltage being selectably variable in amplitude from zero upward either in phase with the amplifier or 180 degrees out of phase therewith. The voltage is selectably inserted into the feedback loop 90 degrees out of phase with the output of the amplifier, whereby, when it is inserted, the frequency of oscillation of the amplifier varies from the predetermined frequency in direction depending upon the phase relationship of the amplifier and voltage and in amount upon the amplitude of the voltage.

5 Claims, 3 Drawing Figures

DUAL MODE CRYSTAL PHASE SHIFT TRANSISTOR OSCILLATOR

SUMMARY OF THE INVENTION

This invention relates to a phase shift oscillator which may be used in two modes: (1) a fixed frequency mode wherein the frequency of oscillation is precisely fixed by a resonator such as a crystal and (2) a variable frequency mode wherein the frequency of oscillation may be varied from that determined by the resonator in either direction in response to a control voltage. Such an oscillator, when used in its first mode, has the advantage of a stable predetermined frequency of oscillation determined by the resonator and a minimum of other circuit elements. It may be placed in a second mode of operation, however, by activating other elements responsive to a control voltage to vary the frequency of oscillation from the predetermined frequency. The oscillator has utility, to cite only one example, in a radio receiver, wherein it may be used in its first mode in one reception circuit, as a fixed frequency oscillator, but may be used in its second mode in a phase locked loop in another reception circuit.

The prior art typically uses a single voltage controlled oscillator to perform both single and multiple frequency operation; but single frequency operation is subject to the variation of the control voltage due to device and environmental changes, which tends to vary the frequency of operation. Variable crystal oscillators are also known, but they tend to include control voltages and extra phase shift networks which are also subject to drift.

The oscillator of this invention comprises an amplifier with a feedback loop from the output to the input thereof, the feedback loop including a resonator providing oscillation of the amplifier at a predetermined frequency, means coupled to the amplifier to generate a voltage oscillating at the same frequency as the amplifier, said voltage being selectably variable in amplitude from zero upward either in phase with the amplifier or 180 degrees out of phase therewith, and means effective to selectively insert the voltage from the last means into the feedback loop 90 degrees out of phase with the output of the amplifier, whereby, when it is inserted, the frequency of oscillation of the amplifier varies from the predetermined frequency in direction depending upon the phase relationship of the amplifier and voltage and in amount upon the amplitude of the voltage.

In particular, the amplifier may be a differential amplifier having a crystal and capacitor pi network in feedback loop around one of the transistors; and the voltage may be generated by a balanced modulator coupled to the differential amplifier and inserted through a capacitor of the pi network. In the first mode of operation, the frequency of oscillation is controlled only by the crystal feedback network for maximum stability, since the voltage controlled elements are effectively removed from the circuit. These elements may be activated when desired to vary the frequency in the second mode of operation. Further details and advantages will be apparent in the accompanying drawing and following description of a preferred embodiment.

DESCRIPTION OF A PREFERRED EMBODIMENT

Figure 1:
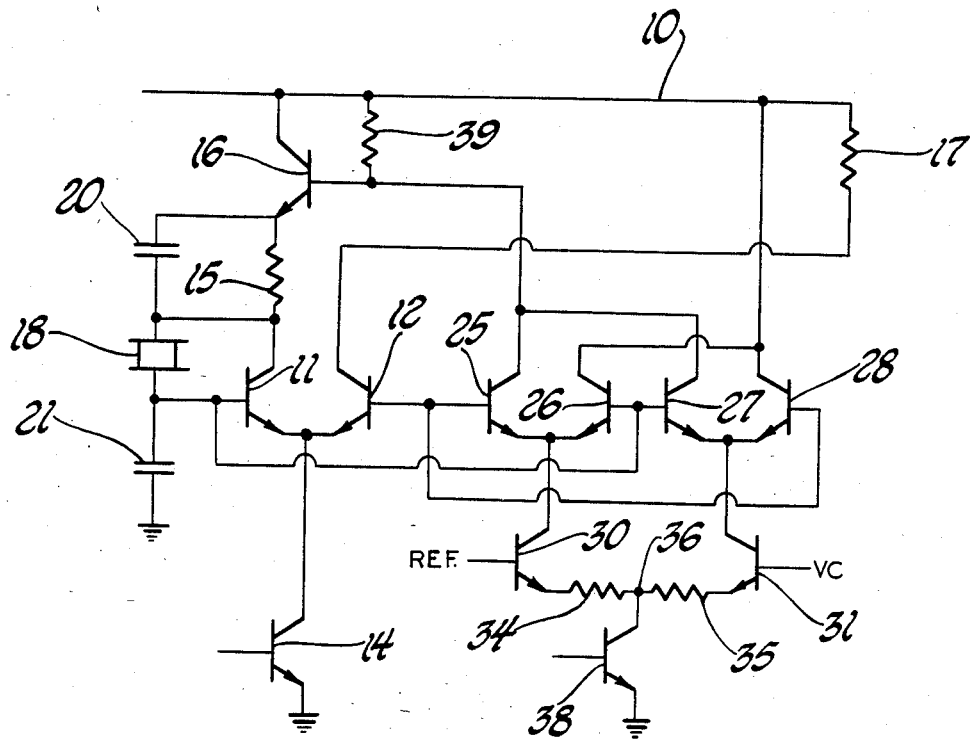
FIG. 1 shows a circuit diagram of a preferred embodiment of the oscillator of this invention.

Referring to FIG. 1, a voltage supply rail 10 is connected to an electric power supply, not shown, capable of supplying current on demand at a predetermined supply voltage. A first differentially connected pair of transistors comprises transistors 11, 12 having emitters coupled together and, through a current source transistor 14, to the ground of the power supply. All transistors in this circuit are shown as NPN, bipolar transistors for illustration only and are not to be restricted thereto; those skilled in the art will be able to construct embodiments of the invention using a variety of transistor types and polarities. In addition, for each of the differentially connected transistor pairs having coupled emitters, the control terminals are bases and the output terminals are collectors. Different types or polarities of transistors might have different names for their control and output terminals without departing from this invention.

The output terminal, or collector, of transistor 11 is connected to supply rail 10, in series, through a load resistor 15 and the emitter and collector of a transistor 16. Likewise, the collector of transistor 12 is connected to supply rail 10 through a load resistor 17. A crystal 18 is connected in a feedback loop from the collector of transistor 11 to its base. A capacitor 20 is connected from the collector of transistor 11 to the emitter of transistor 16, in with resistor 15; and a capacitor 21 is connected from the base of transistor 11 to ground. Crystal 18 and capacitors 20, 21 thus form a pi network in the feedback loop around transistor 11.

A second pair of differentially connected transistors 25, 26 has coupled emitters connected to the collector of a transistor 30. Likewise, a third differentially connected pair of transistors 27, 28 has coupled emitters connected to the collector of a transistor 31. Transistors 30, 31 form a fourth differentially coupled pair having emitters connected through a pair of resistors 34, 35 in series. The junction 36 of resistors 34 and 35 is connected through a transistor 38 to ground. The collectors of transistors 26 and 28 are connected to supply rail 10, and the collectors of transistors 25 and 27 are connected to the base of transistor 16 and also through a resistor 39 to supply rail 10. The bases of transistors 26 and 27 are coupled to the base of transistor 11, and the bases of transistors 25 and 28 are coupled to the base of transistor 12. Elements 25–38 thus form a balanced modulator which applies an output voltage through transistor 16 to the feedback loop at capacitor 20. There are means, not shown, for generating a constant reference voltage REF and applying it to the base or control terminal of transistor 30. Likewise, there are means, not shown, for generating a control voltage and applying it to the base or control terminal of transistor 31. The control voltage VC is a DC voltage but is variable in voltage level to control the output of the balanced modulator. Transistor 38 is a current source for the balanced modulator, which may be switched on and off by the voltage applied to its base to activate and deactivate the balanced modulator.

To provide for operation as a free running crystal oscillator, the voltage at the base of transistor 38 is set low to turn off the balanced modulator 25–38. The pi network 18-21 in the feedback loop around transistor 11 generates a 180 degree phase shift at a predetermined frequency which, when added to the 180 degree phase shift from base to collector of transistor 11, creates positive reinforcing feedback to produce oscillation of the amplifier comprising transistors 11, 12 at the predetermined frequency. In this mode of operation, the oscillator is a standard crystal controlled, phase shift oscillator; and provides the stable and predictable operation associated with such oscillators. It is, in particular, not subject to variations of a control voltage or of additional phase shift networks.

To vary the frequency of operation of the oscillator from the predetermined frequency, transistor 38 is turned on by providing an appropriate DC voltage on its base. This activates the balanced modulator 25-38 which, since it is coupled to the bases of transistors 11, 12, generates an output voltage varying at the same frequency as the frequency of oscillation of amplifier 11, 12. The amplitude and phase of this output, however, vary with the control voltage VC applied to the base of transistor 31, relative to the reference voltage REF applied to the base of transistor 30. If the control and reference voltages are equal, the amplitude of the output is zero. As control voltage VC varies in one direction from the value of reference voltage REF, the amplitude of the output increases in phase with the output of differential amplifier 11, 12. As control voltage VC varies in the opposite direction from the value of reference voltage REF, the amplitude of the output also increases, but 180 degrees out of phase with the output of differential amplifier 11, 12.

Figure 2:
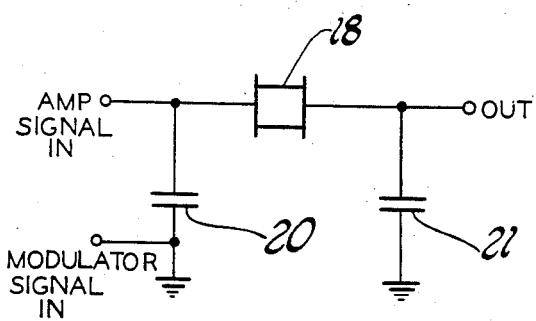
FIG. 2 shows an equivalent circuit of a portion of the circuit of FIG. 1 at the frequency of oscillation.
Figure 3:
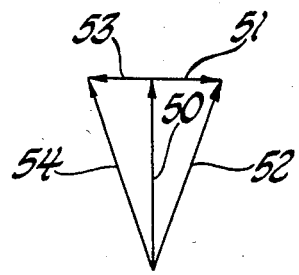
FIG. 3 shows a phasor diagram useful in understanding the operation of FIG. 1.

The output of balanced modulator 25-38 is applied through the emitter of transistor 16 to capacitor 20. The emitter of transistor 16 is, at high frequencies typical of the operation of the oscillator, at ground potential. The pi network 18-21 can thus be shown as the equivalent circuit of FIG. 2, with the output of transitor 11 applied at the terminal labeled "AMP SIGNAL IN" and the modulator signal applied at the terminal labeled "MODULATOR SIGNAL IN". The modulator signal is thus 90 degrees out of phase with the output of transistor 11, due to capacitor 20, as the two are combined. The resultant feedback signal may be understood with reference to the phasor diagram of FIG. 3. If the output of balanced modulator 25-38 has zero amplitude, the feedback signal will be essentially unaffected thereby and the result will be as shown in phasor 50, which represents a phase shift of 180 degrees. If the balanced modulator signal increases in amplitude due to control voltage VC varying in a first direction from reference voltage REF, it will produce the phasor 51. The resultant phasor 52 will have a phase angle differing from 180 degrees in one direction. Thus, in order for oscillation to take place, the oscillator will have to shift its frequency of oscillation in a first direction from the predetermined frequency to the frequency at which the crystal shifts the phase back to 180 degrees. Likewise, if control voltage VC varies in the opposite direction from the reference voltage REF, the amplitude of the balanced modulator output will increase in the opposite phase to generate phasor 53. The resultant phasor 54 will cause a variation in freguency of oscillation in the opposite direction from the predetermined freguency. Clearly, the phasors shown are only examples—a continuous range of frequency adjustment is possible in both directions from the predetermined frequency.

The embodiments of the invention in which an exclusive property or privilege is claimed are defined as follows:

1. A phase shift oscillator comprising, in combination:
an amplifier having input and output;
a feedback from the output to the input of the amplifier, the feedback loop including a resonator, the amplifier and resonator together comprising an oscillator effective to oscillate at a predetermined frequency;
means coupled to the amplifier to generate a voltage oscillating at the same frequency as the combined amplifier and resonator, said generated voltage being selectively variable in amplitude from zero upward either in phase with the voltage at the output of the amplifier or one hundred eighty (180) degrees out of phase therewith;
means effective to shift the phase of the generated voltage from the last means ninety (90) degrees;
means effective to selectively combine the phase shifted generated voltage with the voltage at the output of the amplifier going into the resonator, whereby, when they are combined, the frequency of oscillation of the oscillator varies from the predetermined frequency in direction depending upon the phase of the generated voltage and in amount upon the amplitude of the generated voltage.

2. A phase shift oscillator comprising, in combination:
an amplifier having input and output;
a feedback from the output to the input of the amplifier, the feedback loop including a resonator, the amplifier and resonator together comprising an oscillator effective to oscillate at a predetermined frequency;
balanced modulator means coupled to the amplifier to generate a modulator output voltage oscillating at the same frequency as the combined amplifier and resonator, said balanced modulator means having a reference input provided with a constant reference voltage and a control input provided with a control voltage, the modulator output voltage being selectively variable in amplitude from zero upward either in phase with the amplifier or one hundred eight (180) degrees out of phase therewith as the control voltage is varied relative to the reference voltage;
a capacitor effective to shift the phase of the modulator output voltage ninety (90) degrees; and
means effective to selectively combine the phase shifted modulator output voltage with the amplifier output voltage fed back into the resonator, whereby, when they are combined, the frequency of oscillation of the amplifier thereby varies from the predetermined frequency in direction and amount depending upon the control voltage.

3. A phase shift oscillator comprising, in combination;
an amplifier having input and output;
a feedback from the output to the input of the amplifier, the feedback loop comprising a pi network having a crystal connected from the output to the input of the amplifier and capacitors connected from the input and output of the amplifier to ground, the amplifier and pi network together comprising a crystal phase shift oscillator effective to oscillate at a predetermined frequency;
balanced modulator means coupled to the amplifier to generate a modulator output voltage oscillating at the same frequency as the combined amplifier and pi network, said balanced modulator means having a reference input provided with a constant reference voltage and a control input provided with a control voltage, the modulator output voltage being selectively variable in amplitude from zero upward either in phase with the amplifier output voltage or one hundred eighty (180) degrees out of phase therewith as the control voltage is varied relative to the reference voltage;

a capacitor effective to shift the phase of the modulator output voltage ninety (90) degrees; and means effective to selectively combine the phase shifted modulator output voltage with the amplifier output voltage fed back into the resonator, whereby, when they are combined, the frequency of oscillation of the amplifier thereby varies from the predetermined frequency in direction and amount depending upon the control voltage.

4. A phase shift oscillator comprising, in combination:

an amplifier comprising a first pair of differentially connected transistors having control terminals and output terminals, the control terminals of one of the pair comprising an input therefor and the output terminal of the one comprising an output therefor;

a feedback loop from the output to the input of the amplifier, the feedback loop comprising a pi network having a crystal connected from the output terminal of the one transistor to the control terminal thereof and capacitors connected from each of said terminals to ground, the amplifier and pi network together comprising a crystal phase shift oscillator effective to oscillate at a predetermined frequency;

balanced modulator means comprising second and third pairs of differentially connected transistors coupled to the first pair and comprising a modulator output, the balanced modulator means further comprising a fourth pair of differentially connected transistors having control input terminals and providing, through output terminals, current to the second and third pairs, respectively, of differentially connected transistors to generate a modulator output voltage which oscillates at the same frequency as the combined amplifier and pi network;

means effective to generate a constant reference voltage and a control voltage and provide the same to the control inputs of the fourth pair of differentially connected transistors, the modulator output voltage thereby being selectively variable in amplitude from zero upward in phase with the amplifier as the control voltage is varied in one direction from the reference voltage and one hundred eighty (180) degrees out of phase therewith as the control voltage is varied in the opposite direction from the reference voltage;

a capacitor connected to the output of the one transistor; and means effective to selectively provide the phase shifted modulator output voltage through the capacitor to the optput of the one transistor to shift it ninety (90) degrees in phase and combine the phase shifted modulator output voltage with the amplifier output voltage fed back into the pi network, whereby, when they are combined, the frequency of oscillation of the amplifier thereby varies from the predetermined frequency in direction and amount depending upon the control voltage.

5. A phase shift oscillator comprising, in combination:

a source of electric power;

an amplifier comprising a first pair of differentially connected transistors having control terminals and output terminals, the control terminals of one of the pair comprising an inptut therefor and the output terminal of the one comprising an output therefor and being connected in series with a load resistor, an insertion transistor and the source of electric power;

a feedback loop from the output to the input of the amplifier, the feedback loop comprising a pi network having a crystal connected from the output terminal of the one transistor to the control terminal thereof, a first capacitor connected from the output terminal of the one transistor to the emitter of the insertion transistor and a second capacitor connected from the control terminal of the one transistor to ground, the amplifier and pi network together comprising an oscillator effective to oscillate at a predetermined frequency;

balanced modulator means comprising second and third pairs of differentially connected transistors coupled to the first pair and comprising a modulator output, the balanced modulator means further comprising a fourth pair of differentially connected transistors having control input terminals and providing, through output terminals, current to the second and third pairs, respectively, of differentially connected transistors to generate a modulator output voltage oscillating at the same frequency as the amplifier;

means effective to generate a constant reference voltage and a control voltage and provide the same to the control inputs of the fourth pair of differentially connected transistors, the modulator output volatage thereby being selectively variable in amplitude from zero upward in phase with the amplifier as the control voltage is varied in one direction from the reference voltage or 180 degrees out of phase therewith as the control voltage is varied in the opposite direction from the reference voltage;

circuit means effective to supply the modulator output voltage to the control terminal of the insertion transistor, whereby it is inserted into the feedback loop through the first capacitor 90 degrees out of phase with the output voltage of the amplifier and, when it is inserted, the frequency of oscillation of the amplifier thereby varies from the predetermined frequency in direction and amount depending upon the control voltage; and a current source transistor switchable to activate and deactivate the balanced modulator and thus control said insertion of the balanced modulator output into the feedback loop.

* * * * *